United States Patent [19]

Odashima

[11] Patent Number: 5,336,443
[45] Date of Patent: Aug. 9, 1994

[54] ANISOTROPICALLY ELECTROCONDUCTIVE ADHESIVE COMPOSITION

[75] Inventor: Satoshi Odashima, Saitama, Japan

[73] Assignee: Shin-Etsu Polymer Co., Ltd., Tokyo, Japan

[21] Appl. No.: 20,564

[22] Filed: Feb. 22, 1993

[51] Int. Cl.$^5$ .................. H01B 1/00; H01B 1/04; H01B 1/20; H01B 1/24

[52] U.S. Cl. .................. 252/511; 252/502; 252/510; 423/445 R; 423/447.9; 423/448; 423/460; 201/5; 201/7; 201/42

[58] Field of Search .......... 252/502, 510, 511; 423/445, 447.9, 448, 460; 201/5, 7, 42

[56] References Cited

U.S. PATENT DOCUMENTS

| | | | |
|---|---|---|---|
| 4,217,336 | 8/1980 | Maire et al. | 423/448 |
| 4,228,194 | 10/1980 | Meeder | 428/288 |
| 5,084,211 | 1/1992 | Kawaguchi et al. | 252/511 |

*Primary Examiner*—Paul Lieberman
*Assistant Examiner*—M. Kopec
*Attorney, Agent, or Firm*—McAulay Fisher Nissen Goldberg & Kiel

[57] ABSTRACT

An improvement is proposed in an anisotropically electroconductive adhesive composition comprising an insulating adhesive resin as a matrix and electroconductive carbon particles dispersed in the matrix used for electrically connecting oppositely facing electrode terminals on various kinds of electronic devices and circuit boards. Different from conventional spherical carbon particles, the conductive particles used here are carbon particles each having a plurality of projections on the surface as formed, for example, by the high-temperature calcination of spherical carbon particles blended with a tar or pitch. By virtue of the projections on the carbon particles, the electric connection formed by using the inventive adhesive composition is very reliable and durable even under adverse ambient conditions involving a high temperature, high humidity, vibrations and mechanical shocks by virtue of the anchoring effect by the projections.

6 Claims, No Drawings

ANISOTROPICALLY ELECTROCONDUCTIVE ADHESIVE COMPOSITION

BACKGROUND OF THE INVENTION

The present invention relates to a novel anisotropically electroconductive adhesive composition or, more particularly, to an anisotropically electroconductive adhesive composition used for making electric connection between electrode terminals, for example, of an electric circuit formed on a rigid or flexible printed circuit board and various kinds of electronic devices such as liquid crystal display units.

It is a remarkable trend in recent years that various kinds of electric and electronic instruments are designed to be very compact in size and thickness and are used sometimes under adverse ambient conditions to encounter a high temperature, high humidity and vibrations or mechanical shocks as outdoors and in an automobile engine room. As a matter of course, this trend can be realized only with a substantial improvement in the reliability of electric connection between electrode terminals on various kinds of electronic devices and electric circuits. While it is conventional that such an electric connection is made by using an anisotropically electroconductive adhesive composition consisting of an insulating adhesive resin as a matrix and fine particles having electric conductivity compounded in an appropriate amount with and dispersed in the matrix of the adhesive resin, the above mentioned requirement for higher and higher reliability of the anisotropic electric connection can be achieved by using special high-grade conductive particles which are particles of a metal such as nickel or a plastic resin having particle size distribution as uniform as possible and provided with a plating layer of a noble metal such as gold to exhibit a relatively low contact resistance.

Needless to say, electroconductive powders consisting of particles having a plating layer of a noble metal are very expensive. When the powder is made from a metal such as nickel, in particular, the particles naturally have a density much larger than that of the insulating adhesive resin as the matrix so that a trouble to decrease the workability in preparation is sometimes caused that segregation takes place between the metallic particles and the adhesive resin due to the large difference in the densities.

SUMMARY OF THE INVENTION

The present invention accordingly has an object to provide a novel and improved anisotropically electroconductive adhesive composition which can be prepared with good workability at low costs and still is capable of exhibiting very high reliability in electric connection between the electrode terminals connected therewith to give a full solution to the above described problems in conventional anisotropically electroconductive adhesive compositions.

Thus, the anisotropically electroconductive adhesive composition of the invention is a uniform blend which comprises:

(a) an electrically insulating adhesive resin as the matrix of the composition; and (b) electrically conductive particles of a carbonaceous material dispersed in the matrix, each particle having a particle configuration with a plurality of projections.

The above mentioned carbonaceous powder consisting of particles each having a plurality of projections can be prepared by calcining particles of a carbonaceous material having a substantially spherical particle configuration and coated with an organic material such as pitches and tars at a high temperature to cause graphitization of the carbon particles.

DETAILED DESCRIPTION OF THE PREFERRED EMBODIMENTS

The inventor has conducted extensive investigation to develop a novel anisotropically electroconductive adhesive composition to satisfy the above mentioned requirements and, based on his assumptive idea that the reliability of the electric connection with an anisotropically electroconductive adhesive composition could be improved by suitably modifying the configuration of the electroconductive particles rather than the selection of the material thereof since the reliability of the electric connection could be improved by eliminating the microscopic movement or displacement of the conductive particles within the resinous matrix caused by the internal stress as a result of the changes in the ambient conditions such as temperature and humidity as well as vibrations and mechanical shocks, for which the particle configuration is responsible, leading to the present invention after detailed experimentation.

It is preferable that the electroconductive particles compounded in the inventive anisotropically electroconductive adhesive composition are made from a carbonaceous material which has outstandingly high chemical stability as compared with conventional metallic materials since one of the requirements for the conductive particles is durability to ensure high reliability of the electric connection over a long period of time. In the present invention, each of the particles of the carbonaceous material having a generally spherical configuration essentially has a plurality of projections. Such a particle configuration is advantageous because two or more or, preferably, three or more of contacting points are formed thereby between the surface of the electrode connected with the adhesive composition and each of the conductive particles therein to suppress microscopic movement of the conductive particles in the resinous matrix due to the changes in the ambient conditions and outer mechanical forces or, so to say, to exhibit an anchoring effect.

The number of the projections on each of the conductive particles is preferably at least four in order to fully exhibit the above mentioned effect by the projections. The size of the projections is also important and it is desirable that the end point of each projection is at least 0.5 $\mu$m or, preferably, at least 2 $\mu$m above the surface of the inscribed sphere of the carbon particle or the core portion of the particle without the protrusions.

The conductive particles should have a particle diameter in the range from 5 to 100 $\mu$m and the distribution thereof should be as uniform as possible. When the particle diameter of the conductive particles is too large, a trouble due to short-circuiting is sometimes caused between two adjacent electrodes when an electrode array is electrically connected therewith. The particle diameter implied here is the diameter of an circumscribed sphere to the particle including the projections. The amount of the carbonaceous electroconductive particles compounded with an electrically insulating adhesive resin should be sufficient such that the conductive particles are distributed over the surface of the conductive adhesive composition in the form of a layer in a density in the range from 50 to 500 particles in number per square millimeter of the layer assuming absence of or disregarding overlapping of particles in the direction perpendicular to the plane of the layer.

The carbonaceous electroconductive particles should have a compressive strength of at least 10 kgf/mm$^2$ or, preferably, at least 15 kgf/mm$^2$ at 10% compression in order to withstand the compressive force encountered in press-bonding which concentrates upon the projections.

A carbon powder consisting of particles each having a plurality of projections can be prepared by several different methods. For example, an organic material such as a polymeric resin is shaped and sintered into a sintered mass which is then crushed so that the resultant particles each may have a plurality of projections. Alternatively, carbonaceous particles having a substantially spherical configuration, such as the spherical mesocarbon microbeads and those obtained by the calcination and carbonization of spherical resin particles obtained by the method of bulk polymerization or suspension polymerization, are blended with an organic material such as pitches and tars followed by calcination at a temperature of about 800° to 2500° C. This latter method is preferable to the former method in respect of the higher uniformity of the particle diameter.

The electrically insulating adhesive resin to be compounded with the above described electroconductive particles is not particularly limitative and can be selected from a variety of known resins and other polymeric materials having adhesiveness. Examples of such a polymeric material include ethylene-vinyl acetate copolymeric resins unmodified or modified with carboxyl groups, copolymers of ethylene with methyl, ethyl or isobuityl acrylate, polyamide resins, polyester resins, poly(methyl methacrylate) resins, poly(vinyl ether) resins, poly(vinyl butyral) resins, polyurethane resins, styrene-butadiene-styrene block copolymers unmodified or modified with carboxyl groups, styrene-isoprene-styrene copolymeric resins, styrene-ethylene-butylene-styrene copolymers unmodified or modified with maleic acid, polybutadiene rubbers, polychloroprene rubbers unmodified or modified with carboxyl groups, styrene-butadiene copolymeric rubbers, isoprene-isobutylene copolymers, nitrile rubbers modified with carboxyl groups, epoxy resins, silicone resins and the like. These polymeric materials can be used either singly or as a combination of two kinds or more according to need.

It is optional that the above named adhesive polymeric material is admixed with a tackifier such as rosins and derivatives thereof, terpene resins, terpene-phenol copolymeric resins, petroleum resins, coumarone-indene resins, styrene-based resins, isoprene-based resins, phenolic resins, alkylphenol resins and the like either singly or as a combination of two kinds or more.

Further, the adhesive resin can optionally be admixed with various kinds of known additives including reaction aids or cross-linking agents such as phenolic resins, polyol compounds, isocyanate compounds, melamine resins, urea resins, urotropine compounds, amine compounds, acid anhydrides, organic peroxides, metal oxides, metal salts of an organic acid, e.g., chromium trifluoroacetate, alkoxides of a metal, e.g., titanium, zirconium and aluminum, and organometallic compounds, e.g., dibutyltin oxide, as well as photopolymerization initiators, e.g., 2,2-diethoxy acetophenone and benzil, sensitizer, e.g., amine compounds, phosphorus compounds and chlorine compounds, and so on.

An insulating adhesive resin-based mixture for the matrix is prepared by uniformly blending each in a specified amount of the above described ingredients and the mixture is further admixed with the electroconductive fine particles. Although the conductive particles are fully embedded in and surrounded by the insulating adhesive resin in the adhesive composition as prepared, electric connection can be established between two electrode terminals when they are heat-sealed with a layer of the adhesive comsition interposed therebetween under pressing because the insulating resin intervening between the conductive particle and the surface of an electrode terminal is squeezed out so as to establish direct contacting of the conductive particle and the electrode terminal. Accordingly, it is rather preferable that the affinity between the insulating adhesive resin and the surface of the conductive particles is relatively low so that the conductive particles can be subjected to a surface treatment with a silicone or a fluorocarbon resin so as to decrease the affinity with the insulating adhesive resin. Such a surface-coating layer should have a thickness not exceeding 1 $\mu$m or, preferably, not exceeding 0.1 $\mu$m in order that the surface coating layer per se does not act as a barrier against electric connection.

The anisotropically electroconductive adhesive composition of the invention can be used to establish electric connection between two electrode terminals on two oppositely facing substrates of non-limitative types including printed circuit boards, liquid crystal display units and the like when a layer of the adhesive composition is sandwiched between the electrode terminals and the adhesive resin is cured by applying heat or irradiation with actinic rays such as ultraviolet light, electron beams and the like while the electrode terminals are pressed each against the other. The material of the substrate is not particularly limitative including glass in a liquid crystal display unit, metals of an LSI chip, metal oxides, a film or sheet of a plastic resin such as a polyimide resin, polyester resin and the like as a base of flexible printed circuit boards and so on. The surface of these resin-based substrates usually has polar groups such as hydroxy, carboxyl, carbonyl, methylated carboxyl and the like so that it is desirable that the adhesive resin in the inventive adhesive composition has adhesiveness to be compatible with the polar surface. In this regard, the insulating adhesive resin should have a solubility parameter of at least 8 or, preferably, at least 9.

When a polymeric material such as acrylic resins, nitrile rubbers, polychloroprene rubbers, polyvinyl acetate resins and the like having a high solubility parameter is used as the insulating adhesive, no tackifiers are required for forming the insulating matrix phase of the adhesive composition. On the other hand, it is preferable that a tackifier such as phenolic resins and the like is admixed with the polymeric material when polyisobutylenes, polybutadienes, polystyrenes and the like having a low solubility parameter are used as the base of the adhesive composition so as to modify the polarity.

When the adhesive resin as the base of the inventive adhesive composition is a solid or a highly viscous liquid at room temperature, it is preferable that the inventive adhesive composition is admixed with a suitable volume of an organic solvent so as to be imparted with a decreased consistency suitable for coating on various kinds of substrates by printing, spraying or other known methods. The thus diluted adhesive composition can be directly applied to the electrode terminals to be bonded therewith. Alternatively, a sheet of surface-release paper is coated with the adhesive composition followed by evaporation of the solvent and the sheet cut in an appropriate size is put on the electrode terminals so as to transfer the adhesive layer thereto. The inventive adhesive composition should have a viscosity of 50 to 500 poise at room temperature to facilitate coating of electrode terminals therewith. It is important in diluting the adhesive composition by the addition of an organic solvent that the density of the dispersant phase consisting of the adhesive resin and the solvent is as close as possible to that of the electroconductive particles dispersed therein in order to prevent possible troubles due to segregation of the phases. For example, the density of the dispersant phase should be in the range from one thrid to three times or, preferably, from a half to twice of that of the conductive particles.

In the following, the anisotropically electroconductive adhesive composition of the present invention is described in more detail by way of examples.

EXAMPLE 1

Carbon particles having an average particle diameter of 24 μm were prepared by the calcination of substantially spherical particles of a cured phenolic resin having an average particle diameter of 30 μm. The thus prepared spherical carbon particles were blended with 15% by weight of tar and calcined at 2000° C. under agitation in an atmosphere of nitrogen gas so that the particles were converted into particles having a large number of projections on the surface so as to give an average particle diameter of 30 μm. The thus obtained carbon particles had a density of 1.5 g/cm$^3$.

Separately, an adhesive solution was prepared by dissolving 100 parts by weight of a styrene-ethylene-butylene-styrene copolymeric rubber and 50 parts by weight of a terpene-phenol copolymeric tackifier in toluene in such an amount as to give a solid content of 25% by weight. This adhesive solution had a density of 1.1 g/cm$^3$. An electroconductive adhesive composition was prepared by uniformly dispersing 1.5 parts by weight of the carbon particles with projections in 100 parts by weight of the adhesive solution.

A film of a poly(ethylene terephthalate) resin was printed with a silver paste to form a pattern of electrode terminals in parallel lines with a pitch of 0.3 mm and a line width of 0.15 mm and further overcoated by screen printing with the above prepared electroconductive adhesive composition in a thickness of 25 μm after drying to give a heat-sealable flexible connector sheet. The above mentioned thickness of the coating layer is a value measured at the spot where no carbon particle is found as embedded in the adhesive resin.

A rigid printed circuit board provided with electrode terminals patterned in parallel lines with a pitch of 0.3 mm and a line width of 0.15 mm and a glass plate coated with ITO over the whole surface having a surface resistivity of 30 ohm were electrically connected by heat-sealing with the above prepared connector sheet The thus prepared assembly was subjected to the evaluation test of the electric connection by measuring the electric resistance between two adjacent electrode terminals on the printed circuit board either as prepared or after 200 times repeated heat-shock cycles each cycle consisting of a high-temperature stage at 85° C. for 30 minutes and a low-temperature stage at −30° C. for 30 minutes. The results are shown in ohm in Table 1 below which gives the average value and the highest value.

EXAMPLE 2

The experimental procedure was just the same as in Example 1 except that the carbon particles were used after a surface-release treatment with a fluorocarbon resin. Thus, 100 parts by weight of the carbon particles used in Example 1 were admixed and thoroughly blended with 0.5 part by weight of a fluorocarbon resin-based releasing agent diluted with 50 parts by weight of ethyl alcohol followed by heating at 150° C. for 1 hour to give surface-treated carbon particles which were blended with the adhesive solution. The thus prepared particles had a compressive strength of 18 kgf/mm$^2$ on an average as determined with a microcompression tester for powders.

The results of the evaluation test of this adhesive composition undertaken in the same manner as in Example 1 are also shown in Table 1.

COMPARATIVE EXAMPLE

The experimental procedure was just the same as in Example 1 except that the carbon particles blended with the adhesive solution were those as prepared by the calcination of the cured phenolic resin particles having an average particle diameter of 30 μm.

The results of the evaluation test of this comparative adhesive composition undertaken in the same manner as in Example 1 are also shown in Table 1.

TABLE 1

|  | Initial | | After heat-shock | |
|---|---|---|---|---|
|  | Aver. | Max. | Aver. | Max. |
| Example 1 | 20 | 26 | 22 | 30 |
| Example 2 | 18 | 21 | 19 | 22 |
| Comparative Example) | 31 | 45 | 150 | 400 |

What is claimed is:

1. An anistropically electroconductive adhesive composition which is a uniform blend comprising:
   (a) an electrically insulating adhesive resin as the matrix of the composition; and
   (b) electrically conductive particles of carbon dispersed in the matrix, each particle having a spherical particle configuration with at least four projections projecting therefrom, the endpoint of the projections being at least 0.5 μm above the surface of the inscribed sphere to the particle, said particles having a compressive strength of at least 10 kgf/mm$^2$.

2. An anisotropically electroconductive adhesive composition which is a uniform blend comprising:
   (a) an electrically insulating adhesive resin as the matrix of the composition; and
   (b) electrically conductive particles of carbon dispersed in the matrix, each particle having a spherical particle configuration with at least four projections projecting at least 0.5 μm above the particle surface, and wherein the particles have a diameter in the range from 5 to 100 μm.

3. An anistropically electroconductive adhesive composition which is a uniform blend comprising:
   (a) an electrically insulating adhesive resin as the matrix of the composition; and
   (b) electrically conductive particles of carbon dispersed in a matrix, said particles being obtained by calcining substantially spherical resin particles and blending the calcined particles with a pitch or tar and calcining the blend, said electrically conductive particles having a compressive strength of at least 10 kgf/mm$^2$.

4. The anisotropically electroconductive adhesive composition as claimed in claim 1 in which the electrically conductive particles have a particle diameter in the range from 5 to 100 μm.

5. The anisotropically electroconductive adhesive composition as claimed in claim 1 in which the electrically conductive particles are compounded with the electrically insulating adhesive resin in such an amount that a layer of the adhesive composition contains from 50 to 500 particles in number per square millimeter.

6. The anisotropically electroconductive adhesive composition as claimed in claim 1 in which the electrically conductive particles have a surface layer of a silicone-based or fluorocarbon resin-based surface release agent.

* * * * *